United States Patent [19]

Narusawa

[11] Patent Number: 5,119,386
[45] Date of Patent: Jun. 2, 1992

[54] LIGHT EMITTING DEVICE

[75] Inventor: Tadashi Narusawa, Hirakata, Japan

[73] Assignee: Matsushita Electric Industrial Co., Ltd., Osaka, Japan

[21] Appl. No.: 692,787

[22] Filed: Apr. 29, 1991

Related U.S. Application Data

[63] Continuation-in-part of Ser. No. 466,604, Jan. 17, 1990, abandoned.

[30] Foreign Application Priority Data

Jan. 17, 1989 [JP] Japan .................. 1-8204

[51] Int. Cl.⁵ .................................. H01S 3/19
[52] U.S. Cl. .......................... 372/45; 372/44; 357/16; 357/17
[58] Field of Search ............... 372/45, 44; 357/16, 357/17

[56] References Cited

U.S. PATENT DOCUMENTS 3,803,510  4/1974  Nicoll ...................... 313/439
3,890,503  6/1975  Brewster ................... 378/122

FOREIGN PATENT DOCUMENTS

0119646A1  9/1984  European Pat. Off.
2432213    2/1980  France

OTHER PUBLICATIONS

"The Status of Vacuum Microelectronics", Parker et al.: The 21st Conference on Solid State Devices and Materials, 1989, pp. 1-5.

"The Application of Thin-Film Field-Emission Cathodes to Electronic Tubes", Brodie et al.: Applications of Surface Science 2 (1979), pp. 149-163.

"Field Emission Cathode Array Development for High-Current-Density Applications", Spindt et al.: Applications of Surface Science 16 (1983), 268-276.

"Novel Type of Emissive Flat Panel Display: The Matrixed Cold-Cathode Microtip Fluorescent Display"; G. Labrunie et al., Displays, Jan. 1987, pp. 37-40.

Primary Examiner—Georgia Y. Epps
Attorney, Agent, or Firm—Wenderoth, Lind & Ponack

[57] ABSTRACT

A multi-tip field emission type electron source is fabricated by arranging a multiplicity of micro-size tips so as to be opposedly disposed to a laser active substance composed of an arbitrary semiconductor substance prepared on a conductive substrate, and the space between the two is sealed in vacuum, and the laser oscillation is excited by the electron beams induced by the electric field applied between the two, thereby realizing a solid laser in a simple manner of fabrication. In particular, the invention relates to blue and ultraviolet laser devices using II-VI compound such as ZnSe, or SiC, which were difficult in the prior art.

14 Claims, 7 Drawing Sheets

LIGHT EMITTING DEVICE

This application is a continuation-in-part of now abandoned application, Ser. No. 07/466,604 filed on Jan. 17, 1990.

BACKGROUND OF THE INVENTION

This invention is intended to present a blue laser device of the similar method as the conventional infrared and red laser diode, by introducing a method based on a new principle in the method of exciting light emitting devices such as semiconductor laser highly valuable in the field of optoelectronics, and further optimizing the construction.

The blue laser beam is keenly demanded in the field where laser beams of short wavelength are desired such as information processing and measurements, and is strongly needed to be developed as early as possible. However, the materials capable of emitting blue laser beams are limited to only a part of crystal systems large in band gaps, and in order to obtain laser diodes by the conventional current injection by using such materials, the crystal growth technology is not sufficient yet. It is also proposed to obtain blue laser beams by using harmonics of long wavelength, but the output is small, which is not suited to integration structurally. The invention is intended to present a blue laser device of high performance on the basis of new principle and construction by eliminating the difficulties of the prior art, and its industrial value of use is extremely high.

Various excitation methods of laser device are known and realized. In the solid laser and liquid laser, light of an intense flash lamp or auxiliary laser device is emitted to form an inversion distribution (optical pumping). In the gas laser, a plasma state is produced by application of a high voltage, and gas is excited by mutual collision of atoms, ions and electrons in the plasma. In most semiconductor lasers, an electric current is injected into the p-n junction to form an inversion distribution. Very rarely, if the p-n junction is not formed favorably, optical pumping or electron beam excitation have also been attempted in semiconductor lasers.

In the conventional method of electron beam excitation, electrons released from an ordinary hot cathode are accelerated to an adequate energy (100 eV to 10 keV) to irradiate the active layer, and therefore the device size is large, and the heat of the hot cathode raises the temperature of the active layer, and these adverse effects are unavoidable. That is, the conventional attempts of optical pumping of semiconductor laser and electron beam excitation were the methods used as the means for evaluating the properties of the semiconductor crystals serving as the active layers, and were not the methods for allowing the devices to act practically as useful devices.

Thus, in almost all conventional semiconductor lasers, p-type and n-type clad layers were provided, and the active layer was placed between them. Such a structure is excellent for efficient excitation by current injection, but it cannot be employed without the preliminary condition that p-type and n-type crystals of high quality be obtained easily. Such a condition is satisfied by GaAs or InP crystals, and the laser diodes useful in the wavelength regions of infrared and red light are practical. On the other hand, SiC or ZnSe-ZnS crystals having band gaps corresponding to the blue wavelength region involve intrinsic difficulties in crystal growth, and in spite of efforts in development for over 10 years, free conductivity control has not yet been achieved at present, and the future outlook is not necessarily bright. Therefore, considering the extension of the conventional structure, the possibility of the realization of a blue semiconductor laser device is, in fact, extremely small. Incidentally, in the excitation method conventionally employed in the solid laser or gas laser, it is impossible, in principle, to reduce the size to that of an ordinary semiconductor laser.

Vacuum sealing of a space in a micrometer size has not been experienced in the past. The size of a conventional vacuum tube was larger by many orders of magnitudes, and although voids on the order of a micrometer might be formed in the refining process of metal, they were not formed intentionally by man. But by employing the modern sub-micron processing technology advanced mainly from the demands of Si technology, the past dream has come to be realized.

Lasers to emit blue light include Ar and other gas laser, solid lasers, excimer laser, and dye laser. They are all commercially available, and are used in measurement or auxiliary means for film deposition, but in these lasers, according to their principle, it is difficult to reduce the size. This is because the atoms and molecules as the source of emission are scattered about sporadically in space, and a considerably large volume (total number of emission sources) must be required in order to obtain a threshold emission intensity to reach the laser oscillation. Besides, the method of excitation involves other problems. In order to form a plasma state, a high voltage of tens of keV must be applied, and in order to withstand such a voltage, the electrode interval naturally becomes wider, which is contradictory to reduction of size. As a construction completely different in principle from such gas lasers, a second harmonic generator (SHG) is known, and it is noticed as a blue laser beam source as small as an ordinary semiconductor laser. The SGH is, by making use of the nonlinear characteristics of lithium niobate ($LiNbO_3$) or the like, intended to convert the output of an ordinary semiconductor laser releasing infrared rays into harmonics of doubled frequency and to output them. The SHG is used as a blue light source, but, as its demerits, the size is slightly larger than that of a semiconductor laser, and the output light is, in the Cerenkov radiation type, delivered at a certain angle to the plane including the input light and waveguide so that it is not suited to integration with other devices, and the conversion efficiency into harmonics is small and hence the output is small.

SUMMARY OF THE INVENTION

It is hence a primary object of the invention to apply the general excitation means of an electron beam excitation method in a small size and in a form free from adverse effects by heat, and also to apply this excitation method in crystals in which it is difficult to form p-n junctions, thereby inducing laser oscillation. In particular, it is intended to obtain blue laser devices by applying the electron beam excitation method of the invention to the II-VI compound semiconductors which were conventionally considered difficult to apply for lasers because of the insufficient crystal growth technology, and at the same time to present a vacuum sealing method of a tiny space in a micrometer size as an important means for realizing the invention.

BRIEF DESCRIPTION OF THE INVENTION

Figure 3A:
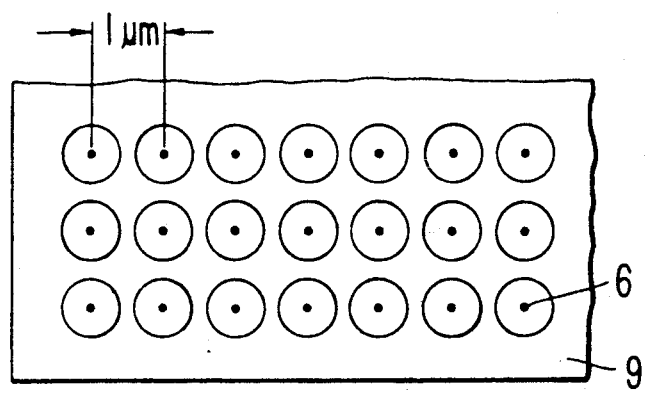
Figure 3B:
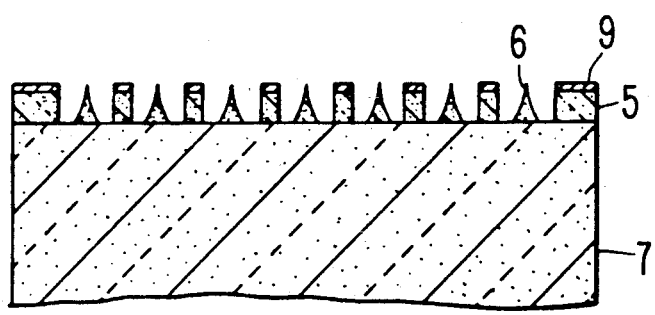
Figure 4:
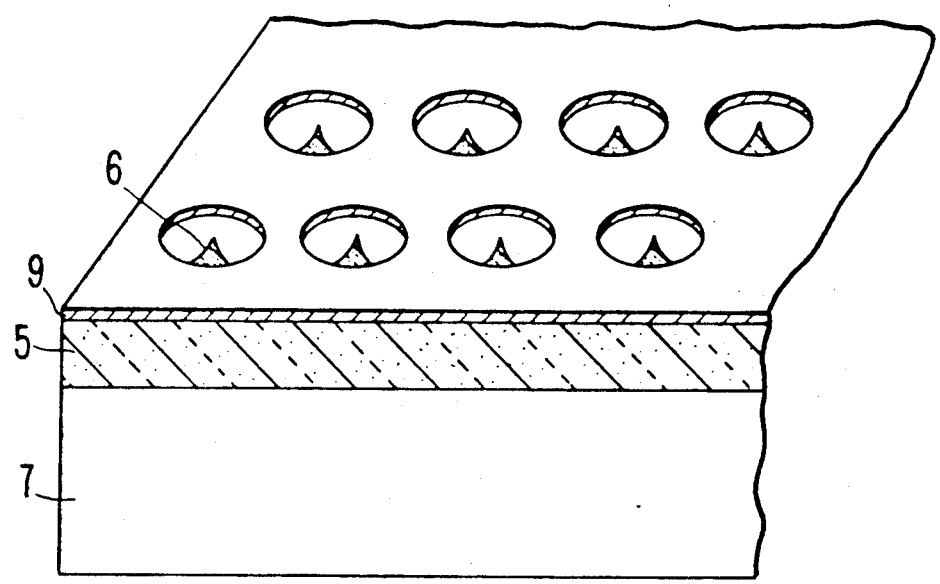
Figure 5:
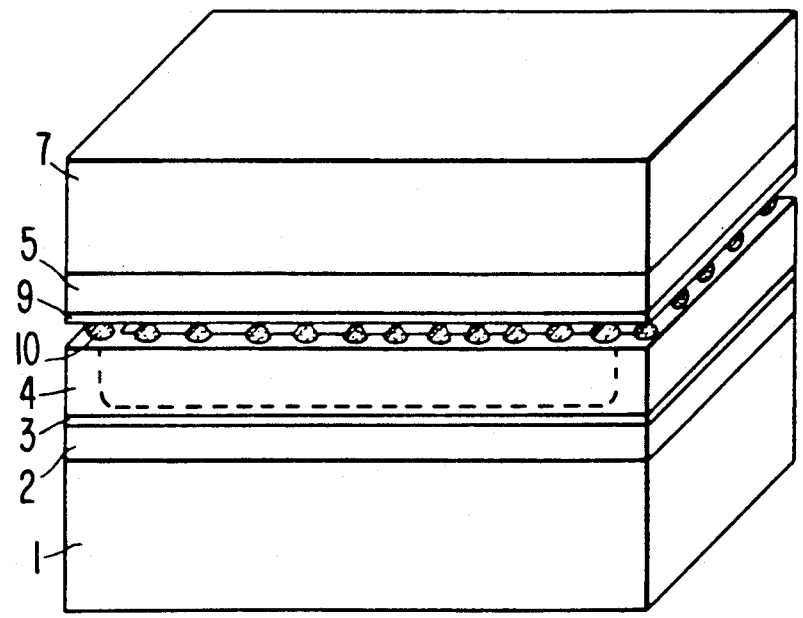
Figure 6A:
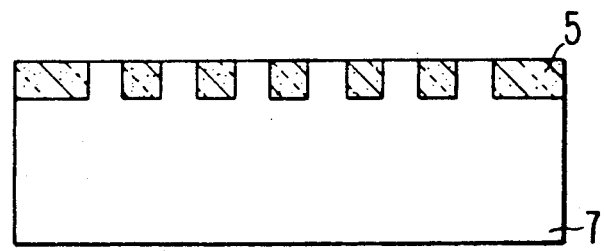
Figure 6B:
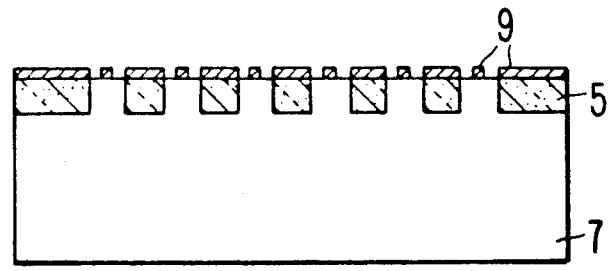
Figure 6C:
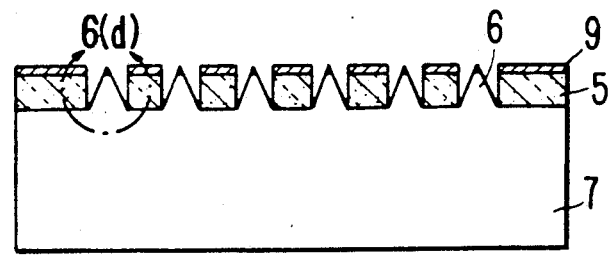
Figure 6D:
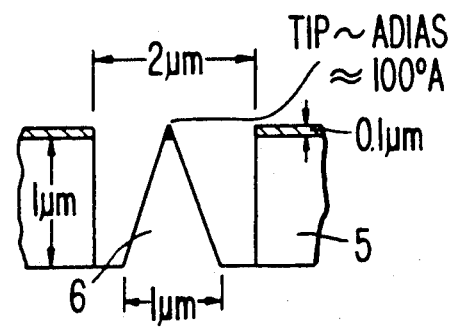
Figure 7:
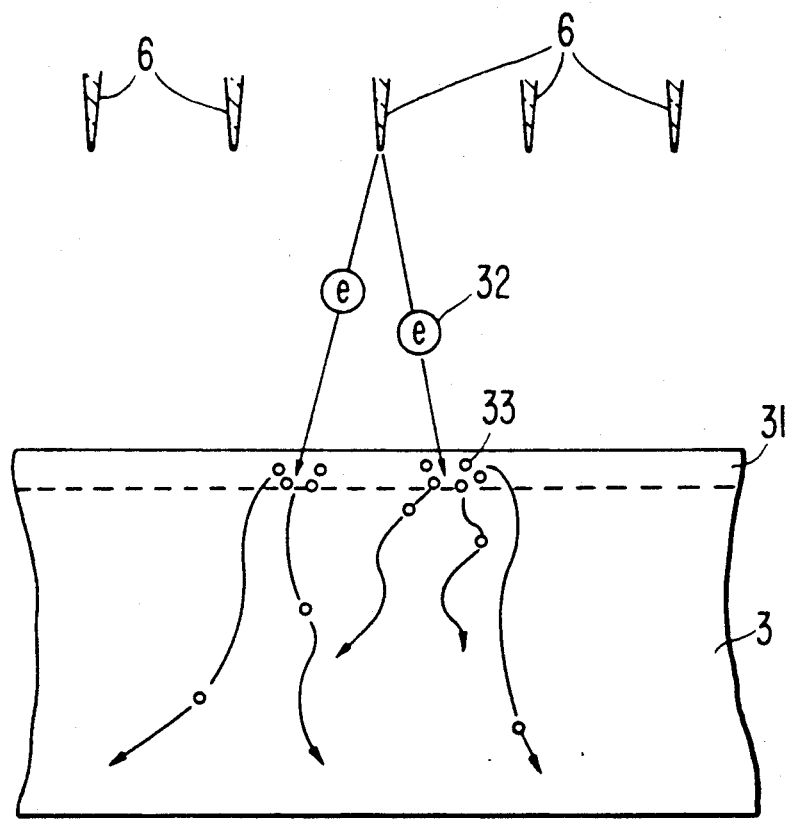

FIGS. 3(a) and 3(b) are respectively a plan view and a sectional view of an example of multi-tip field emission type electron source;

FIG. 4 is a perspective view of the same electron source;

FIG. 5 is a schematic diagram of a method for vacuum sealing of a micro-space by using indium particles;

FIGS. 6(a), 6(b), and 6(c) are schematic process sectional views of a method of forming multi-tips;

FIG. 7 is a schematic diagram of operation of the device of the invention.

Figure 1:
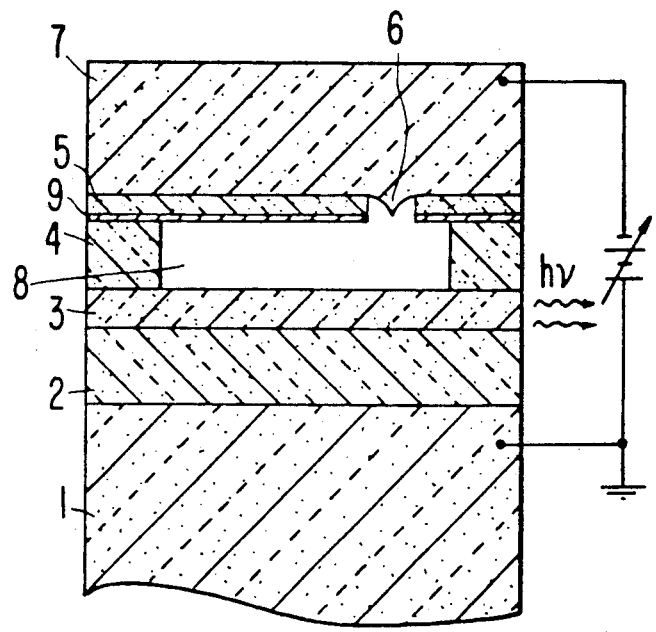
FIG. 1 is a sectional view of a structure of light emitting device opposedly disposing an active layer and a multi-tip field emission type electron source in an excitation method of light emitting device active layer by field emission type electron beam in an embodiment of the invention.
Figure 8:
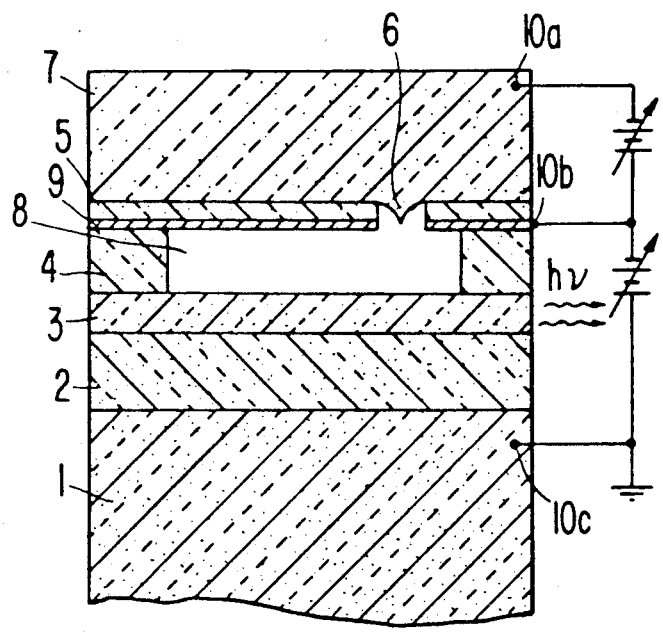

FIG. 8 is a sectional view of a modified version of the structure of FIG. 1.

Figure 9:
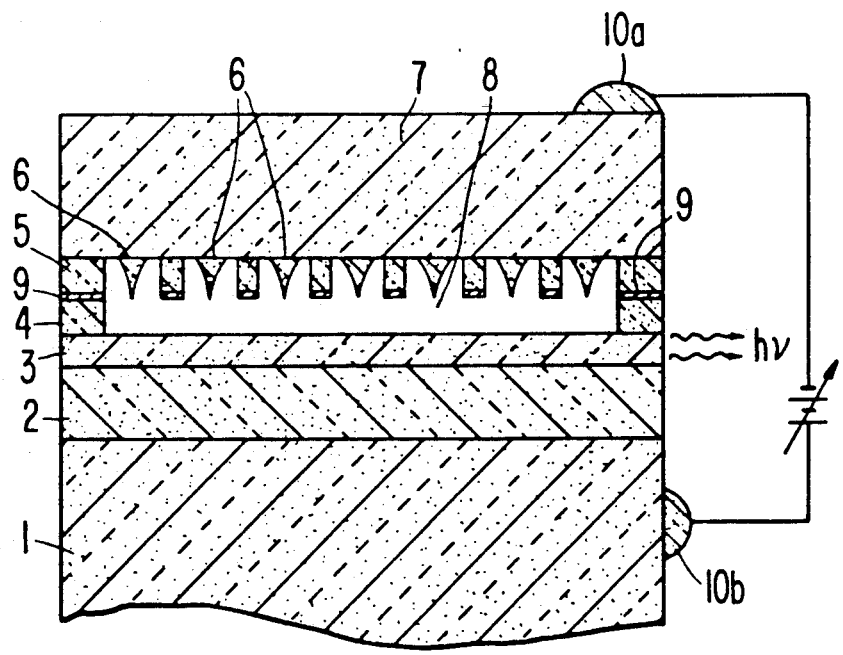
Figure 10:
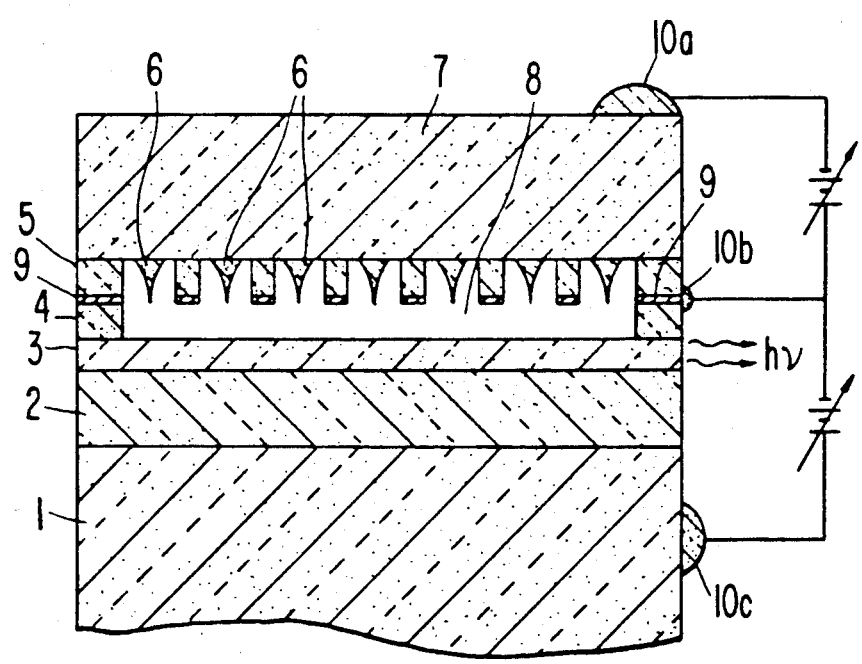

FIG. 9 shows the structure of another multi-tip field emission type electron source and FIG. 10 shows a modified version of the structure of FIG. 9.

In the drawing figures, the labeled elements are as follows:

1: GaAs substrate, 2: ZnS clad layer, 3: ZnSe active layer, 4: $SiO_2$ film, 5: $SiO_2$ film, 6: tip, 7: Si substrate, 8: vacuum space, 9: Mo thin film electrode, 10: In particle.

DETAILED DESCRIPTION OF THE INVENTION

FIG. 1 is a schematic diagram of opposedly disposed light emitting active layer and multi-tip field emission electron source. Element 1 is a p-type or n-type high doped GaAs substrate. Element 2 is a clad layer of n-type ZnS (thickness 1 μm). Element 3 is an active layer of n-type ZnSe (thickness 0.1 μm). The layers 2 and 3 were epitaxially grown on the GaAs substrate 1 by ordinary crystal growth means such as metalorganic vapor phase epitaxy (MOVPE) and molecular beam epitaxy (MBE). It must be noted here that, in II-VI compound semiconductors, n-type crystals can be easily obtained but p-type crystals are not easily obtained. This is the reason why it is difficult to form p-n. Elements 4 and 5 are insulating films of $SiO_2$ or the like, and the total thickness of the films 4 and 5 is 10 μm. The insulating film 4 is cored out by leaving only the circumference, and a free space 8 is left inside by photolithography or similar technique. Element 9 is a metal electrode thin film of molybdenum or the like, and 6 is a field emission type tip.

Figure 2:
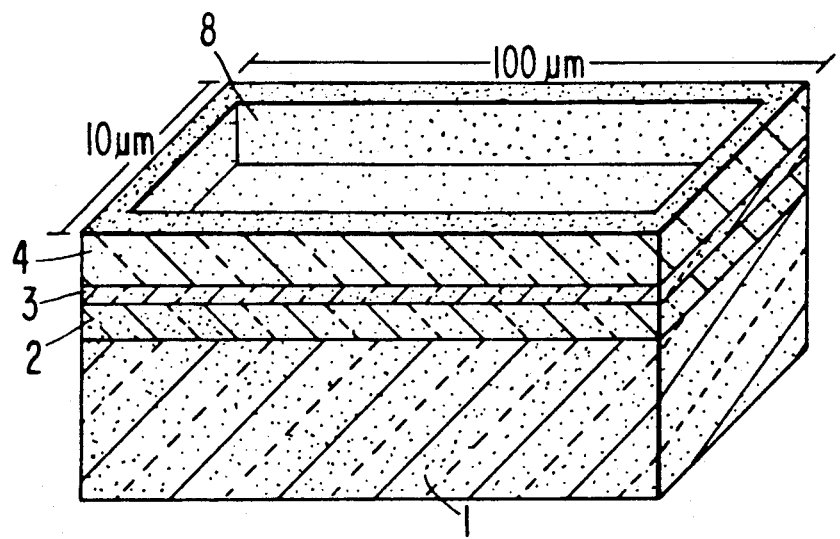
FIG. 2 is a perspective view of an example of insulating film structure for vacuum sealing of a micro-space.

FIG. 2 is a perspective view of elements 1, 2, 3, 4. Element 7 is a conductive substrate, which may be either a p-type or n-type Si substrate, or a metal substrate. Numeral 6 denotes field emission tips machined on the surface of the substrate 7, and they are arranged on the surface of the substrate 7 as shown in the plan view and sectional view in FIGS. 3(a) and 3(b) and the perspective view in FIG. 4. The field emission characteristics of the tips 6 are described, for example, in the publication by C. A. Spindt, et al.: Applications of Surface Science 16 (1983), pp. 266-276. As the fabrication of this structure, the method of utilizing the anisotropic etching of Si crystals, the method of employing the cone-shaped deposition of Mo thin film, or the method of discharge machining may be considered among others.

For example, the method of fabrication of multi-tips by selective sputtering method is shown. In FIG. 6, the Si oxide film 5 is formed on the Si substrate 7 by an ordinary technique, and is patterned as shown in the plan view in FIG. 3(a). The center distance of circles is 0.5 μm to tens of μm, and the radius of circles is 0.25 μm to tens of μm so that the adjoining circles may not overlap. Afterwards, a metal much smaller in the sputtering yield than Si, for example, molybdenum 9 is deposited. The thickness of the molybdenum film 9 is 100 Å to 1 μm, or may be thinner or thicker. At this time, the molybdenum is deposited on the entire surface of the $SiO_2$, as dots of about 100 Å in diameter in the center of the circular form on Si. The dot deposition method may be either direct patterning by convergent ion beam, or the method of first depositing on the whole surface including Si and then removing by etching, leaving only the center dots by sub-micron processing technology. After formation of dots of molybdenum 9, when sputtering is effected from a direction vertical to the substrate surface with argon ion beam or the like by using the dots of molybdenum 9 as mask, Si is selectively sputtered and Si tips 6 are formed. An example of tip size is shown in the drawing. Meanwhile, the Mo thin film left over on the $SiO_2$ 5 may be used as the modulation electrode of light emitting device of the invention. The Mo left over at the front end of the Si tips 6 does not exert any adverse effect. On the contrary, it is effective as the protective film of the front end of the tips.

In FIG. 1, element 8 is an infinitesimal vacuum space of about 1 μm in depth, and the vacuum sealing method for forming this space 8 is schematically shown in FIG. 5. That is, the substrate structures in FIG. 2 and FIG. 4 are opposedly disposed, and, for example, indium particles 10 of 1 μm in diameter are arranged at proper intervals as shown in the drawing. Several methods may be considered for disposing the In particles 10 of 1 μm, and an example is described. First, by ordinary vacuum deposition, an In film of about 0.1 to 0.4 μm in thickness is deposited on the insulating film 4 at low temperature (or room temperature). As a result, a polycrystalline film of a uniform thickness is formed. Afterwards, the substrate is heated to a temperature above the melting point of In (157° C.), and In is melted, and lumps are formed by surface tension. Since the size of the lumps depends on the heating temperature and heating time, a proper condition is selected so that the particle size may be 1 μm. Such process is realized by the fact that the liquid In is hardly wettable on the insulating film and is easily wettable on the metal. When the entire structure is put in an evacuating tank to be evacuated by pump for a long time, the air in the open space 8 in the insulating film 4 is removed through the gaps among the In particles. After sufficiently evacuating, heat is applied from outside to raise the entire temperature to about 300° C., then the In particles are melted, and the insulating film 4 and the metal thin film 9 tightly contact with each other, thereby achieving vacuum sealing. In FIG. 5, for the convenience' sake, In particles 10 are used, but it is not easy to handle particles of 1 μm in diameter. Therefore, instead of using particles, an indium film may be deposited on the insulating film 4. Keeping the insulating film 4 at an appropriate temperature, when indium is deposited, the indium film is grown like an island, and the result is the same as when indium particles are used.

In FIG. 1. incidentally, after vacuum sealing, when a bias (several volts to hundreds of volts) is applied between the substrates 1 and 7, the field intensity at the front end of the tips 6 is extremely strong when the radius of curvature of the tip front end is smaller, and electrons are emitted by field emission. The electrons reach the surface of the active layer 3 while being accelerated in the vacuum space 8. Since the electron energy is several to hundreds of eV, it is enough for exciting the electrons of valence band into the conduction band by exceeding the band gaps of ZnSe (~2.6 ev). By the electron beams in this energy region, the penetration depth in solid is 100 Å at most, and the entire active layer 3 having a thickness of 0.1 μm cannot be directly excited by the electron beam, but since the conductive electrons excited near the surface diffuse to spread about 1 μm, it is finally possible to form an inversion distribution over the entire active layer 3. The operation of the device is shown schematically in FIG. 7. The electron 32 emitted from the tip 6 is accelerated to several to hundreds of eV to enter the active layer 3, and multiple electrons 33 are excited in the conduction band. The depth of penetration of incident electrons is 100 Å at most, and therefore the active layer region directly excited by the incident electrons is limited only to a part 31 of the entire active layer 3. However, since the electrons 33 in the conduction band possess a diffusion length of over 1 μm at room temperature, when the electron beams are entered continuously, finally, the conduction band electrons distribute over the entire active layer, thereby realizing an inversion distribution. Thus, by forming a resonator by machining the both end faces of the active layer 3 in cleaved mirror or the like, laser oscillation is obtained. In this invention, not only the conventional laser devices, but also the laser devices difficult in the prior art may be realized. That is, by using the InP or GaAs alloy crystals as active layer, conventional laser devices with the wavelength of 1.5 to 0.65 μm may be fabricated, or by using wide-gap semiconductors such as ZnSe, ZnS, SiC, green, blue or ultraviolet laser devices with wavelengths of 0.5 μm or less may be realized. What limits the output power is the temperature rise of the active layer by electron beam emission, but it is not particularly difficult to obtain 10 mW as in the conventional semiconductor laser.

FIG. 8 is almost the same as FIG. 1 of this application. The difference between these figures is that in FIG. 8, the conductive film 9 is connected to voltage source so that the conductive film can be biased. By this structure, the amount of electrons emitted from the tip 6 by applying voltage between substrates 1 and 7 is controlled according to the bias voltage applied to the conductive film 9. In other words, the amount of electrons which is radiated to the active layer 3 is controllable so that the amount of light emitted from the active layer 3 is controllable. FIG. 9 shows the entire structure of a multi-tip field emission type electron source. The multi-tip structure for field emission was originally shown in FIGS. 3(a), 3(b), 4, 6(a)-6(c). FIG. 10 is a modification of the structure of FIG. 0. The difference between these two figures is that the bias is applied to conductive film 9 in the same manner as that of FIG. 7. Incidentally, elements 10a, 10b, and 10c in FIGS. 8-10 are electrodes.

The conductive film 9 functions as a switch for controlling the amount of electrons emitted from the field emission tip 6. Therefore, even if the conductive film 9 does not exist, electron can be emitted from tip 6 by applying appropriate voltage between the substrates 1 and 7. A circuit for controlling the conductive film 9 is shown FIG. 8 discussed above.

As shown in this embodiment, what is characteristic of the light emitting device of the invention is that p-n junction is unnecessary. No matter whether the substrate is p-type or n-type, it is enough if it is conductive. The active layer may be insulating because the electric field penetrates through. It is thus full of flexibility, and by applying the invention, many other important light emitting devices may be realized. For example, when narrow-gap semiconductors such as CdTe are used as active layer, far-infrared light emitting devices will be obtained, or by using wide-gap semiconductors (insulators) such as diamond and SiC, ultraviolet light emitting devices will be obtained. It is also possible to apply to materials known hitherto such as YAG. In this case, the invention is very effective for downsizing the devices to an extreme extent.

In this invention, since the electron beams emitted from the multi-tip field emission type electron source which does not release heat are used for exciting the active layer, the device may be downsized, and it is suited to integration. Furthermore, the vacuum sealing method of the infinitesimal space presented in the invention may serve not only as an important means for realizing the light emitting device, but also as a basic technology in other fields, such as electronics (vacuum microelectronics).

What is claimed is:

1. A light emitting device comprising:
an active layer comprising an active substance;
a field emission type electron source having a conductive substrate which has at least one tip formed at a predetermined position of a major surface of said substrate, said active layer and said field emission type electron source being disposed opposite to each other with a predetermined distance therebetween in a vacuum in such a manner that said at least one tip opposes said active layer;
a first electrode electrically coupled to said active layer; and
a second electrode electrically coupled to said field emission type electron source;
whereby an electron beam emitted from said at least one tip in response to an application of a voltage between said first and second electrodes is directly radiated to a surface of said active layer which is located opposite to said at least one tip so as to excite said active layer.

2. A light emitting device according to claim 1, wherein a II-IV compound semiconductor comprises said active substance.

3. A light emitting device according to claim 1, wherein a plurality of tips are disposed in said conductive substrate of said field emission type electron source.

4. A light emitting device according to claim 3, wherein said field emission type electron source is formed by sputtering.

5. A light emitting device according to claim 1, wherein said predetermined distance is in the range of 1 μm to 10 mm.

6. A light emitting device according to claim 1, wherein said voltage to be applied between said first and second electrodes is in the range of several volts to several hundred volts.

7. A light emitting device according to claim 1, further comprising an insulating film disposed in said predetermined distance between said active layer and field emission type electron source to form said vacuum.

8. A light emitting device according to claim 1, wherein said conductive substrate of said field emission type electron source having at least one tip also comprises said second electrode.

9. A light emitting device according to claim 1, further comprising an insulating film disposed on a surface of said conductive substrate of said field emission type electron source in such manner that said insulating film surrounds said at least one tip.

10. A light emitting device according to claim 1, further comprising a clad layer disposed between said active layer and first electrode.

11. A light emitting device comprising:
an active layer comprising active substance;
a conductive substrate having at least one tip formed at a predetermined position of a major surface of said substrate, said active layer and conductive substrate being disposed opposite to each other with a predetermined distance therebetween in such manner that said at least one tip opposes said active layer;
an insulating film disposed in said predetermined distance between said active layer and conductive substrate to form a vacuum therebetween;
a first electrode electrically coupled to said active layer;
a second electrode electrically coupled to said conductive substrate; and
a clad layer disposed between said active layer and first electrode;
whereby an electron beam emitted from said at least one tip in response to an application of a voltage between said first and second electrodes is directly radiated to a surface of said active layer which is located opposite to said at least one tip so as to excite said active layer.

12. A light emitting device comprising:
an active layer comprising active substance;
a field emission type electron source having a conductive substrate which has at least one tip formed at a predetermined position of a major surface of said substrate, said active layer and field emission type electron source being disposed opposite to each other with a predetermined distance therebetween in such a manner that such at least one tip opposes said active layer;
a conductive film disposed in the vicinity of said at least one tip;
a first electrode electricity coupled to said active layer; and
a second electrode electricity coupled to said field emission type electron source;
whereby an electron beam emitted from said at least one tip in response to an application of a voltage between said first and second electrodes is directly radiated to a surface of said active layer which is located opposite to said at least one tip so as to excite said active layer, and an amount of electrons emitted by said electron means is controlled by applying a voltage to said conductive film.

13. A light emitting device according to claim 12, further comprising a first insulating film disposed in said predetermined distance layer and field emission type electron source to form said vacuum.

14. A light emitting device according to claim 12, wherein said conductive film is formed on the surface of said second insulating film.

* * * * *